United States Patent
Furuya

(10) Patent No.: US 8,742,009 B2
(45) Date of Patent: Jun. 3, 2014

(54) TEMPORARY ADHESIVE COMPOSITION, AND METHOD OF PRODUCING THIN WAFER

(75) Inventor: Masahiro Furuya, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 437 days.

(21) Appl. No.: 13/109,193

(22) Filed: May 17, 2011

(65) Prior Publication Data

US 2011/0297300 A1    Dec. 8, 2011

(30) Foreign Application Priority Data

Jun. 4, 2010   (JP) ................................ 2010-128464

(51) Int. Cl.
*C08L 83/08*   (2006.01)

(52) U.S. Cl.
USPC ......................................................... 524/588

(58) Field of Classification Search
USPC ......................................................... 524/588
See application file for complete search history.

(56) References Cited

U.S. PATENT DOCUMENTS

| | | | |
|---|---|---|---|
| 7,541,264 B2 | 6/2009 | Gardner et al. | |
| 2003/0234458 A1 | 12/2003 | Gardner et al. | |
| 2005/0232557 A1 | 10/2005 | Gardner et al. | |
| 2005/0233547 A1 | 10/2005 | Noda et al. | |
| 2007/0025678 A1 | 2/2007 | Kushibiki et al. | |
| 2008/0090380 A1 | 4/2008 | Gardner et al. | |

FOREIGN PATENT DOCUMENTS

JP    2006-328104    12/2006

OTHER PUBLICATIONS

Extended European Search Report issued on Sep. 5, 2011 in the corresponding European Application No. 11004557.2.

*Primary Examiner* — Kuo-Liang Peng
(74) *Attorney, Agent, or Firm* — Oblon, Spivak, McClelland, Maier & Neustadt, L.L.P.

(57) ABSTRACT

A temporary adhesive for which temporary adhesion is simple and subsequent detachment is also simple, meaning productivity can be improved. Also, a method of producing a thin wafer that uses the temporary adhesive. The temporary adhesive composition comprises:

(A) an organopolysiloxane comprising:
(I) 40 to 99 mol % of siloxane units represented by $R^1SiO_{3/2}$ (T units),
(II) 0 to 49 mol % of siloxane units represented by $R^2R^3SiO_{2/2}$ units (D units) and
(III) 1 to 25 mol % of siloxane units represented by $R^4R^5R^6SiO_{1/2}$ units (M units)

(wherein each of $R^1$ to $R^6$ represents an unsubstituted or substituted monovalent hydrocarbon group of 1 to 10 carbon atoms),
and having a weight-average molecular weight exceeding 2,000, and
(B) an organic solvent having a boiling point of not more than 220° C.

11 Claims, 1 Drawing Sheet

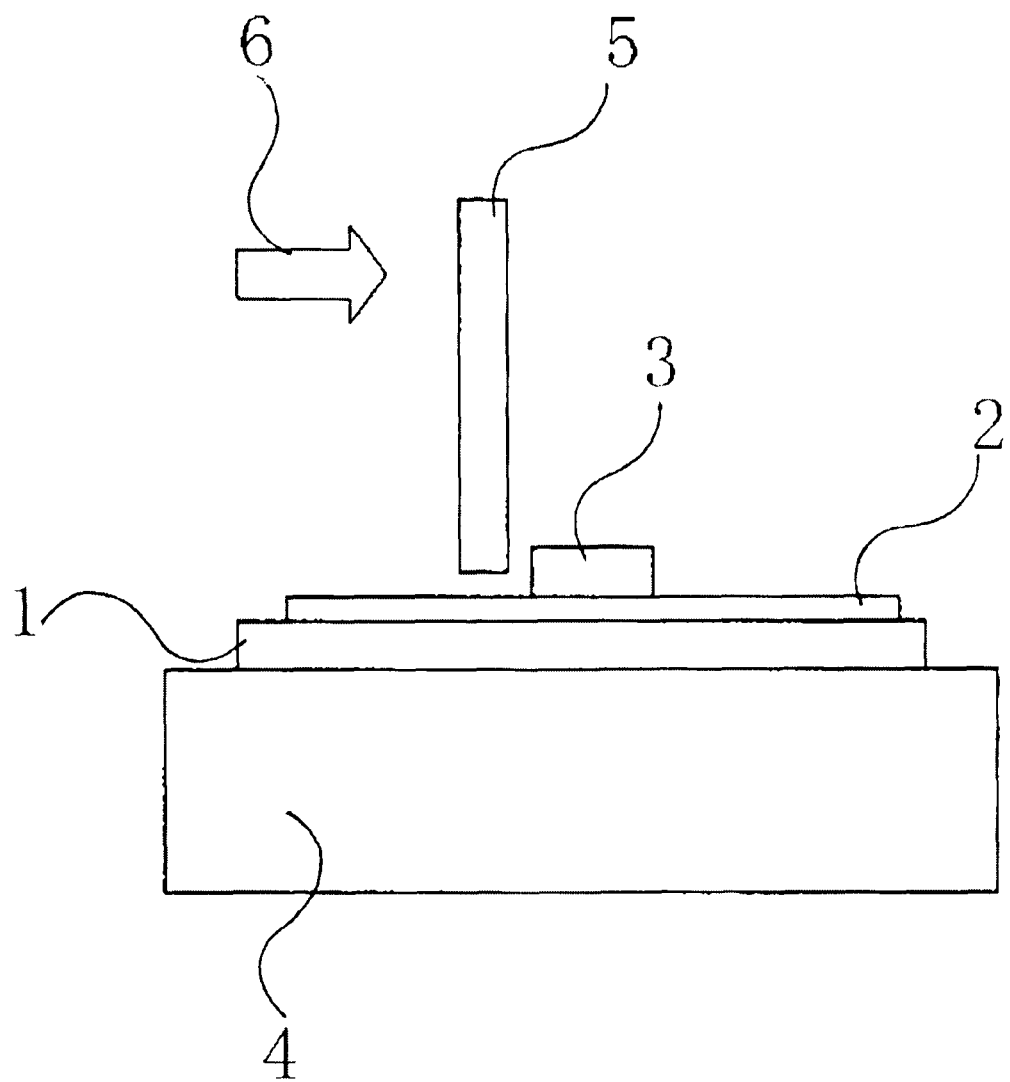

TEMPORARY ADHESIVE COMPOSITION, AND METHOD OF PRODUCING THIN WAFER

CROSS REFERENCES TO RELATED APPLICATIONS

This application claims priority to Japanese Patent Application No. 2010-128464, filed on Jun. 4, 2010.

BACKGROUND OF THE INVENTION

1. Field of the Invention

The present invention relates to a temporary adhesive composition which, by heating, is able to control the bonding between substrates, bonding between a substrate and a support, and the detachment of items that have been bonded together. The invention also relates to a method of producing a thin wafer that uses the adhesive.

2. Description of the Prior Art

Three-dimensional semiconductor mounting has become an essential process for achieving increased packing densities and higher capacities. The three-dimensional mounting technique is a semiconductor fabrication technique in which single semiconductor chips are reduced in thickness to form thin chips, and a plurality of layers of these chips are then stacked together with through-silicon vias (TSV) used for electrical connections between the layers. In order to realize this type of structure, a substrate having a semiconductor circuit formed thereon must be subjected to grinding of the non-circuit-formed surface (also referred to as the "back surface") to reduce the thickness of the substrate, and electrodes including TSVs must then be formed on the back surface. During the back surface grinding of the silicon substrate, a protective tape is bonded to the opposite side of the substrate to the grinding surface, thereby preventing wafer breakage during grinding. However, this tape uses an organic resin film as the base material which, although exhibiting good flexibility, suffers from inadequate strength and heat resistance, meaning it is not suited to the subsequent back surface wiring layer formation process.

Accordingly, a system has been proposed in which the semiconductor substrate is bonded to a support of silicon or glass or the like using an adhesive, thereby achieving a structure that is able to satisfactorily withstand both the back surface grinding and the back surface electrode formation steps. In this system, the adhesive used when bonding the substrate to the support is an important factor. The adhesive must be capable of bonding the substrate to the support with no voids therebetween, have sufficient durability to withstand the subsequent processing steps, and then finally, must allow the thin wafer to be easily detached from the support. Because this detachment is performed in the final step, in this description, the adhesive is termed a "temporary adhesive".

Conventional temporary adhesives and detachment methods that have been proposed include a technique in which an adhesive containing a light-absorbing substance is irradiated with high-intensity light, thereby decomposing the adhesive layer and enabling the adhesive layer to be detached from the support (Patent Document 1:US 2005/0233547 A1), and a technique in which a heat-meltable hydrocarbon-based compound is used as the adhesive, and bonding and detachment are both performed with the adhesive in a heated and melted state (Patent Document 2: JP 2006-328104 A). The former technique requires expensive equipment such as a laser or the like, and also suffers from the problem that the processing time per substrate is long. Although the latter technique is controlled solely be heating, and is therefore relatively simple, the heat stability of the hydrocarbon-based compound at high temperatures exceeding 200° C. is inadequate, meaning the applicable temperature range is narrow.

Further, a technique that uses a silicone pressure-sensitive adhesive as the temporary adhesive has also been proposed (Patent Document 3: U.S. Pat. No. 7,541,264). In this technique, the substrate is bonded to a support using an addition reaction-curable silicone pressure-sensitive adhesive, and then at the time of detachment, the structure is immersed in a chemical agent that dissolves or decomposes the silicone resin, enabling the substrate to be detached from the support. However, this detachment requires an extremely long period of time, making it difficult to apply the technique to an actual production process.

PRIOR ART DOCUMENTS

Patent Documents

Patent Document 1: US 2005/0233547 A1
Patent Document 2: JP 2006-328104 A
Patent Document 3: U.S. Pat. No. 7,541,264

SUMMARY OF THE INVENTION

Accordingly, an object of the present invention is to provide a temporary adhesive for which temporary adhesion is simple and subsequent detachment is also simple, meaning productivity can be improved, and also to provide a method of producing a thin wafer that uses the temporary adhesive.

The inventors of the present invention discovered that a composition composed of an organopolysiloxane and an organic solvent that acts as a diluting solvent was effective in achieving the above object.

In other words, the present invention provides a temporary adhesive composition comprising:

(A) an organopolysiloxane comprising:

(I) 40 to 99 mol % of siloxane units represented by $R^1SiO_{3/2}$ (T units), (II) 0 to 49 mol % of siloxane units represented by $R^2R^3SiO_{2/2}$ units (D units) and (III) 1 to 25 mol % of siloxane units represented by $R^4R^5R^6SiO_{1/2}$ units (M units) (wherein each of $R^1$ to $R^6$ represents an unsubstituted or substituted monovalent hydrocarbon group of 1 to 10 carbon atoms), and having a weight-average molecular weight exceeding 2,000, and (B) an organic solvent having a boiling point of not more than 220° C.

With the temporary adhesive of the present invention, bonding and detachment can be controlled by heating. The temporary adhesive can bond two target items together at a temperature of not more than 200° C., but also exhibits excellent thermal stability at temperatures of 200° C. or higher. The method of producing a thin wafer according to the present invention that uses the above-mentioned temporary adhesive exhibits excellent productivity.

BRIEF DESCRIPTION OF THE DRAWINGS

FIG. 1 is a schematic illustration describing a detachment test method used in the examples.

DETAILED DESCRIPTION OF THE PREFERRED EMBODIMENTS

A more detailed description of the present invention is presented below.

<Temporary Adhesive Composition>
—(A) Organopolysiloxane—

The organopolysiloxane of the component (A) is essentially unreactive, and comprises 40 to 99 mol %, and preferably 50 to 95 mol %, of siloxane units represented by $R^1SiO_{3/2}$ (T units), 0 to 49 mol %, and preferably 10 to 40 mol %, of siloxane units represented by $R^2R^3SiO_{2/2}$ units (D units), and 1 to 25 mol %, and preferably 3 to 20 mol %, of siloxane units represented by $R^4R^5R^6SiO_{1/2}$ units (M units).

In the above-mentioned units, each of the organic substituents $R^1$, $R^2$, $R^3$, $R^4$, $R^5$ and $R^6$ represents an unsubstituted or substituted monovalent hydrocarbon group of 1 to 10 carbon atoms, and specific examples include hydrocarbon groups, including alkyl groups such as a methyl group, ethyl group, vinyl group, n-propyl group, isopropyl group, n-butyl group, t-butyl group, n-pentyl group and n-hexyl group, cycloalkyl groups such as a cyclopentyl group and cyclohexyl group, alkenyl groups such as a vinyl group and allyl group and aryl groups such as a phenyl group and tolyl group, and substituted hydrocarbon groups in which at least a portion of the hydrogen atoms within one of the above hydrocarbon groups have been substituted with a halogen atom such as a chlorine or bromine atom, or a cyano group, such as a cyanomethyl group and trifluoropropyl group. These substituents must be unreactive. A methyl group, vinyl group, n-propyl group or phenyl group is preferred. The phenyl group content is particularly important in maintaining a high degree of heat resistance, and relative to the combined total of all the organic substituents, the phenyl group content is preferably not less than 40 mol %, and is more preferably within a range from 50 to 90 mol %.

The organopolysiloxane has a softening point that is preferably within a temperature range from 40 to 300° C., more preferably from 40 to 230° C., and still more preferably from 40 to 200° C., and is preferably a solid at temperatures not exceeding 40° C., and preferably at temperatures within a range from 0 to 30° C.

In the organopolysiloxane, if the amount of T units is less than 40 mol %, then the organopolysiloxane tends not to be solid at temperatures not exceeding 40° C., and the solubility within organic solvents tends to deteriorate, resulting in either insufficient solubility or even insolubility. Further, from the viewpoint of the thermal stability described below, the organopolysiloxane of the present invention preferably contains no reactive terminal groups such as silanol groups or hydrolyzable residues. Accordingly, unreactive M units are preferably introduced at the terminals, and the amount of those M units is preferably not less than 1 mol %.

The D units are unreactive structural units that may optionally exist within the organopolysiloxane, but if the amount of the D units exceeds 49 mol %, then the organopolysiloxane tends not to be solid at temperatures not exceeding 40° C., but rather tends to exist as a viscous material having fluidity or even a liquid. As a result, the bonding between the support and the wafer tends to deteriorate, increasing the danger of problems such as misalignment between the wafer and the support that constitute the stacked structure during the back surface grinding or subsequent processing steps.

The M units are unreactive units, the amount of which is typically within a range from 1 to 25 mol %, and preferably from 3 to 20 mol %. If this amount is less than 1 mol %, then ensuring that the organopolysiloxane has a structure which is soluble in organic solvents and yet has a satisfactorily reduced number of reactive terminal groups such as silanol groups and hydrolyzable groups tends to become difficult. In contrast, if the amount of M units exceeds 25 mol %, then the organopolysiloxane has a structure with a large number of terminals and a relatively small molecular weight, which is unsuitable.

The organopolysiloxane is essentially unreactive, and even if some molecular terminals that have not been blocked with unreactive M units exist within the molecule, such as terminals having silanol groups or hydrolyzable residues such as an alkoxysilyl group, the amount of these reactive terminal groups is preferably suppressed to a minimum. If silanol groups or terminal residues such as alkoxysilyl groups exist within the molecule in large amounts, then cross-linking via a condensation reaction tends to occur when heat is applied, which dramatically alters the detachability of the substrate and is therefore undesirable. The total amount of OH groups from silanol groups and OR groups from alkoxysilyl groups (Si—OR, wherein OR represents an alkoxy group residue of the alkoxysilane used as a raw material, such as a methoxy group, ethoxy group, n-propoxy group or isopropoxy group), within the entire organopolysiloxane is preferably not more than 4% by mass, and more preferably 2% by mass or less. Introduction of the M units enables the amount of these types of reactive terminal groups to be reduced to the desired level. The combination of hydrolyzable groups and silanol groups is preferably not more than 2% by mass.

The molecular weight of the organopolysiloxane, measured by GPC (gel permeation chromatography) and reported as a weight-average molecular weight value obtained by using a calibration curve prepared using standard polystyrenes (in the present invention, this molecular weight is referred to as the "weight-average molecular weight") is preferably greater than 2,000. If this weight-average molecular weight is 2,000 or less, then the organopolysiloxane tends to either not solidify at 10 to 20° C., or suffer from inferior heat resistance. The weight-average molecular weight is preferably within a range from approximately 3,000 to 80,000, and more preferably from approximately 3,000 to 50,000.

Furthermore, in addition to the T units, D units and M units mentioned above, the organopolysiloxane of the present invention may also comprise siloxane units represented by $SiO_{4/2}$ (Q units). The amount of these Q units is preferably within a range from 0.1 to 30 mol %, and more preferably from 0.2 to 20 mol %.

If the amount of Q units exceeds 30 mol %, then although the produced organopolysiloxane readily becomes a solid, significant intramolecular cross-linking tends to occur, meaning the solubility in solvents tends to deteriorate, or control of the softening point within the ideal range becomes difficult, either of which is undesirable.

A typical example of an organopolysiloxane of the component (A) that also comprises Q units is an organopolysiloxane composed of:

(I) 40 to 98.9 mol % of the above-mentioned T units,
(II) 0 to 48.9 mol % of the above-mentioned D units,
(III) 0.1 to 30 mol % of the above-mentioned Q units, and
(IV) 1 to 25 mol % of the above-mentioned M units.

The organopolysiloxane of the component (A) can be produced using conventional methods. For example, the organopolysiloxane can be obtained via a hydrolysis-condensation reaction, by mixing organochlorosilanes and/or organoalkoxysilanes or partial hydrolysis-condensation products thereof that correspond with each of the desired siloxane units with a mixed solvent containing a sufficient excess of water to ensure that all the hydrolyzable groups (such as chlorine atoms and alkoxy groups) are hydrolyzed and an organic solvent that is capable of dissolving the raw material silane compounds and the product organopolysiloxane, and then allowing the hydrolysis-condensation reaction to proceed. In order to obtain an organopolysiloxane with the desired weight-average molecular weight, the reaction temperature and time, and the amounts of water and the organic solvent can be adjusted as required. Prior to use, the unnecessary organic solvent may be removed to produce a powder if required.

—(B) Organic Solvent—

The component (B) is preferably an organic solvent that is capable of dissolving the organopolysiloxane of the component (A) to form a solution, which can then be applied by a conventional film formation method such as spin coating to form a thin film with a thickness of 1 to 100 μm. The thickness of this film is more preferably within a range from 5 to 80 μm, and still more preferably from 10 to 60 μm.

Further, organic solvents having a boiling point exceeding 220° C. are not desirable as they tend to be difficult to volatilize, even during the heated drying performed following the coating step, and are therefore more likely to be retained within the film. This retained solvent can cause the formation of gas bubbles at the bonding interface when the bonded structure is exposed to high temperatures during the heating process that is performed following the bonding of the substrate.

Specific examples of organic solvents having a boiling point of not more than 220° C., and preferably within a range from 50 to 220° C., which can be used as the component (B) include the solvents listed below, and the component (B) may be a mixture of two or more of them. Preferably, component (B) is at least one organic solvent selected from the organic solvents exemplified below.

Hydrocarbons: pentane, hexane, cyclohexane, decane, isododecane, limonene

Ketones: acetone, methyl ethyl ketone, methyl isobutyl ketone, cyclopentanone, cyclohexanone Esters: ethyl acetate, butyl acetate, ethyl lactate, ethyl propionate, propylene glycol monomethyl ether acetate Ethers: tetrahydrofuran, cyclopentyl methyl ether Alcohols: ethanol, isopropanol, butanol, ethylene glycol, ethylene glycol monomethyl ether, propylene glycol, propylene glycol monomethyl ether Of the above solvents, isododecane, cyclopentanone, cyclohexanone, propylene glycol monomethyl ether acetate and propylene glycol monomethyl ether are ideal.

The organic solvent of the component (B) is used in an amount of from 11 to 150 parts by mass, preferably from 25 to 100 parts by mass per 100 parts by mass of the organopolysiloxane of the component (A) from the viewpoint of workability and easy formation of an adhesive layer with a desired thickness.

—Other Components—

Besides the component (A) and the component (B) described above, if required, a conventional surfactant or the like may be added to improve the coating properties of the composition. Specifically, a nonionic surfactant is preferred, examples of which include a fluorine-based surfactant, perfluoroalkyl polyoxyethylene ethanol, fluorinated alkyl ester, perfluoroalkyl amine oxide or fluorine-containing organosiloxane-based compound.

Further, in order to further enhance the heat resistance of the composition, a conventional antioxidant or a filler such as silica may also be added.

<Method of Producing Thin Wafer>

In the method of producing a thin wafer according to the present invention, the organopolysiloxane described above is used as the adhesive layer for bonding a wafer having a semiconductor circuit and a support that is used in reducing the thickness of the wafer. The thickness of the thin wafer obtained using the production method of the present invention is typically within a range from 5 to 300 μm, and more typically from 10 to 100 μm.

The method of producing a thin wafer according to the present invention includes steps (a) to (e) described below.

[Step (a)]

Step (a) comprises bonding the circuit-formed surface of a wafer comprising a circuit-formed surface and a non-circuit-formed surface to a support with an adhesive layer composed of the temporary adhesive composition described above disposed therebetween. The wafer comprising a circuit-formed surface and a non-circuit-formed surface is a wafer in which one surface is the circuit-formed surface and the other surface is the non-circuit-formed surface. The wafer to which the present invention is applied is typically a semiconductor wafer. Examples of the semiconductor wafer include not only silicon wafers, but also germanium wafers, gallium arsenide wafers, gallium phosphide wafers, and aluminum gallium arsenide wafers and the like. Although there are no particular limitations on the thickness of the wafer, the thickness is typically within a range from 600 to 800 μm, and more typically from 625 to 775 μm.

Examples of the support include silicon sheets, glass sheets and quartz sheets and the like. In the present invention, because there is no necessity to irradiate an energy beam through the support and onto the adhesive layer, the support need not necessarily be formed of a light-transmissive material.

The adhesive layer is a layer composed of the above-described temporary adhesive composition. The adhesive layer is formed on either one or both of the circuit-formed surface of the wafer and one surface of the support, and the circuit-formed surface of the wafer is then bonded to the support surface via the adhesive layer. The formation of the adhesive layer on the wafer circuit-formed surface and/or the support surface is achieved by applying the above temporary adhesive composition to the appropriate surface or surfaces, and then drying the composition to remove the organic solvent of the component (B). The drying is typically performed by heating at a temperature of 80 to 200° C.

The adhesive layer of the present invention is softened by heating. The temperature range across which the resin (organopolysiloxane) of the adhesive layer undergoes softening is preferably within a range from 40 to 300° C., more preferably from 40 to 230° C., and still more preferably from 40 to 200° C., and by subjecting the wafer and the support to uniform compression under reduced pressure at a temperature within this range, a stacked product comprising the wafer bonded to the support is formed. More specifically, a chamber in which the wafer and the support have been installed is heated, under reduced pressure, to a temperature within the above range, thereby softening or melting the organopolysiloxane within the adhesive layer, and the wafer and the support are then brought into contact and subjected to thermocompression bonding, thus enabling a uniform bonding interface to be formed without the incorporation of gas bubbles at the bonding interface. During the bonding of the wafer to the support via the adhesive layer, the temperature of the support is preferably within the temperature range mentioned above. Because the organopolysiloxane within the adhesive layer undergoes softening at the above bonding temperature, any irregularities that exist on the surface of the wafer undergoing bonding can be completely filled, with no voids. The compression applied is typically not more than 63 N/cm², preferably within a range from 1 to 32 N/cm², and more preferably from 2 to 23 N/cm². In other words, in the case of an 8-inch wafer, bonding may be conducted under an applied load of not more than 20 kN, preferably not more than 10 kN, and more preferably 7 kN or less.

Commercially available apparatus can be used as the wafer bonding apparatus, and examples include the EVG520IS and 850TB systems manufactured by EV Group, and the XBC300 Wafer Bonder manufactured by SUSS MicroTec AG.

[Step (b)]

Step (b) comprises grinding the non-circuit-formed surface of the wafer that has been bonded to the support, namely, grinding the back surface on the wafer side of the stacked structure obtained by the bonding performed in step (a), thereby reducing the thickness of the wafer. There are no particular limitations on the method used for grinding the wafer back surface, and conventional grinding methods may be used. The grinding is preferably performed with continuous cooling by applying water to the wafer and the grinding stone. Examples of apparatus that can be used for the grinding of the wafer back surface include the DAG-810 Grinder manufactured by DISCO Corporation.

[Step (c)]

Step (c) comprises processing the ground non-circuit-formed surface of the wafer that has been reduced in thickness by the back surface grinding. This step includes a variety of processes used at the wafer level. Examples of these processes include electrode formation, metal wiring formation and protective film formation and the like. More specific examples of the processes include various conventional processes such as metal sputtering which is used for forming electrodes and the like, wet etching which is used for etching metal sputtered layers, pattern formation by application, exposure and developing of a resist, which is used for forming a mask for metal wiring formation, as well as resist removal, dry etching, metal plating formation, silicon etching for TSV formation, and oxide film formation on silicon surfaces and the like.

[Step (d)]

Step (d) comprises detaching the wafer that has been processed in step (c) from the support, namely, detaching the reduced thickness wafer that has been subjected to a variety of processes from the support prior to dicing of the wafer. Although there are no particular limitations on the detachment method employed, the main examples include methods that comprise heating the wafer and the support while sliding the wafer and the support in opposing horizontal directions to achieve detachment, methods that comprise securing either the wafer or the support of the stacked structure horizontally and then heating the structure while the other non-secured component is lifted off at a predetermined angle from the horizontal, and methods that comprise bonding a protective film to the ground surface of the wafer and subsequently peeling the wafer and the protective film away from the support.

In the present invention, any of these detachment methods may be employed, but the horizontal slide detachment method is particularly suitable. In this method, the stacked structure is heated, and when the adhesive layer has reached a melted or softened state, a horizontal force is applied to detach the wafer from the support. For the adhesives used in the present invention, the heating temperature is preferably within a range from 50 to 300° C., more preferably from 60 to 230° C., and still more preferably from 70 to 200° C.

Examples of apparatus that can be used for performing this detachment include the EVG850 DB system manufactured by EV Group, and the XBC300 Wafer Bonder manufactured by SUSS MicroTec AG.

[Step (e)]

The step (e) comprises removing residual adhesive from the circuit-formed surface of the detached wafer. This removal of residual adhesive can be achieved, for example, by cleaning the wafer.

In the step (e), any cleaning liquid that is capable of dissolving the organopolysiloxane within the adhesive layer can be used, and specific examples of the cleaning liquid include ketones such as acetone, cyclopentanone, cyclohexanone, 2-butanone, methyl isobutyl ketone, 2-heptanone and 2-octanone, esters such as butyl acetate, methyl benzoate and γ-butyrolactone, cellosolves such as butyl cellosolve acetate, propylene glycol monomethyl ether and propylene glycol monomethyl ether acetate, amides such as N,N-dimethylformamide, N,N-dimethylacetamide and N-methyl-2-pyrrolidone, and alcohols such as isopropanol and butanol. Among these, ketones, esters, cellosolves and alcohols are preferred, and propylene glycol monomethyl ether, propylene glycol monomethyl ether acetate, n-methyl-2-pyrrolidone, acetone, cyclopentanone, cyclohexanone, 2-butanone, methyl isobutyl ketone and isopropanol are particularly desirable. These solvents may be used individually or in mixtures containing two or more different solvents. Further, in those cases where removal of the residual adhesive proves difficult, a base or acid may be added to the solvent if required. Examples of bases that may be added include amines such as ethanolamine, diethanolamine, triethanolamine, triethylamine and ammonia, and ammonium salts such as tetramethylammonium hydroxide. Examples of acids that may be used include organic acids such as acetic acid, oxalic acid, benzenesulfonic acid and dodecylbenzenesulfonic acid. The amount added of the acid or base, reported as a concentration within the cleaning liquid, is typically within a range from 0.01 to 10% by mass, and preferably from 0.1 to 5% by mass. Further, in order to further improve the removability of the residue, a conventional surfactant may also be added to the cleaning liquid. Examples of the cleaning method employed include puddle cleaning methods using the liquid described above, spray cleaning methods, and methods that involve immersion in a tank containing the cleaning liquid. Cleaning is typically performed at a temperature of 10 to 80° C., and preferably 15 to 65° C.

EXAMPLES

Synthesis of Organopolysiloxanes

Preparation Example 1

A 1 L flask fitted with a stirrer, a cooling device and a thermometer was charged with 234 g (13 mols) of water and 35 g of toluene, and the flask was then heated to 80° C. in an oil bath. A dropping funnel was charged with 148 g (0.7 mols) of phenyltrichlorosilane, 51 g (0.20 mols) of diphenyldichlorosilane and 9 g (0.1 mols) of trimethylchlorosilane, and the resulting mixture in the dropping funnel was then added dropwise to the flask with constant stirring over a period of one hour. Following completion of the dropwise addition, the reaction mixture was stirred for a further one hour at 80° C. Subsequently, the reaction mixture was left to settle while cooling to room temperature, the separated water phase was removed, and then a water washing operation, in which a 10% by mass aqueous solution of sodium sulfate was mixed with the toluene phase for 10 minutes, the resulting mixture was left to settle for 30 minutes, and the separated aqueous phase was then removed, was repeated until the toluene phase was neutral, thereby halting the reaction. An ester adapter was then connected to the flask, and the toluene phase containing the organopolysiloxane was heated under reflux to remove residual water from the toluene phase. Once the temperature inside the flask had reached 110° C., the reflux was continued for a further one hour, and the toluene solution was then cooled to room temperature. The thus obtained organopolysiloxane solution was filtered to remove impurities, and the toluene was then removed by distillation under reduced pressure, yielding 125 g of a solid organopolysiloxane (resin 1).

The obtained organopolysiloxane comprised 70 mol % of T units, 20 mol % of D units and 10 mol % of M units, 79 mol % of the organic substituents on the Si atoms were phenyl groups, the terminals included 0.03 mols of silanol groups per 100 g of the organopolysiloxane, the external appearance was of a colorless transparent solid, and the weight-average molecular weight was 9,600. Further, the softening point of the resin was 90° C.

Preparation Example 2

An apparatus was setup in a similar manner to Preparation Example 1, the 1 L flask was charged with 234 g (13 mols) of water and 35 g of toluene, and the flask was then heated to 80° C. in an oil bath. With the exception of charging the dropping funnel with 116 g (0.55 mols) of phenyltrichlorosilane, 51 g (0.2 mols) of diphenyldichlorosilane, 13 g (0.1 mols) of dimethyldichlorosilane and 16 g (0.15 mols) of trimethylchlorosilane, preparation was conducted in the same manner as Preparation Example 1, yielding 132 g of a solid organopolysiloxane (resin 2).

The thus obtained organopolysiloxane comprised 55 mol % of T units, 30 mol % of D units and 15 mol % of M units, 59 mol % of the organic substituents on the Si atoms were phenyl groups, the terminals included 0.02 mols of silanol groups per 100 g of the organopolysiloxane, the external appearance was of a colorless transparent solid, and the weight-average molecular weight was 11,200. Further, the softening point of the resin was 78° C.

Preparation Example 3

An apparatus was setup in a similar manner to Preparation Example 1, the 1 L flask was charged with 234 g (13 mols) of water, 35 g of toluene and 1 g of methanesulfonic acid, and the flask was then heated to 80° C. in an oil bath. With the exception of subsequently charging the dropping funnel with 119 g (0.6 mols) of phenyltrimethoxysilane, 24 g (0.1 mols) of diphenyldimethoxysilane, 6 g (0.05 mols) of dimethyldimethoxysilane, 15 g (0.1 mols) of tetramethoxysilane and 16 g (0.15 mols) of trimethylmethoxysilane, preparation was conducted in the same manner as Preparation Example 1, yielding 123 g of a solid organopolysiloxane (resin 3).

The thus obtained organopolysiloxane comprised 60 mol % of T units, 15 mol % of D units, 10 mol % of Q units and 15 mol % of M units, 59 mol % of the organic substituents on the Si atoms were phenyl groups, the terminals included 0.04 mols of silanol groups per 100 g of the organopolysiloxane, the external appearance was of a colorless transparent solid, and the weight-average molecular weight was 10,200. Further, the softening point of the resin was 110° C.

Comparative Preparation Example 1

An apparatus was setup in a similar manner to Preparation Example 1, the 1 L flask was charged with 234 g (13 mols) of water and 35 g of toluene, and the flask was then heated to 80° C. in an oil bath. With the exception of charging the dropping funnel with 53 g (0.25 mols) of phenyltrichlorosilane, 101 g (0.4 mols) of diphenyldichlorosilane, 32 g (0.25 mols) of dimethyldichlorosilane and 11 g (0.1 mols) of trimethylchlorosilane, preparation was conducted in the same manner as Preparation Example 1, yielding 143 g of a highly viscous organopolysiloxane (comparative resin 1).

The thus obtained organopolysiloxane comprised 25 mol % of T units, 65 mol % of D units and 10 mol % of M units, 57 mol % of the organic substituents on the Si atoms were phenyl groups, the terminals included 0.01 mols of silanol groups per 100 g of the organopolysiloxane, the external appearance was of a colorless transparent solid, and the weight-average molecular weight was 11,700. This resin exhibited fluidity at room temperature, but the softening point of a solid sample prepared by cooling was 23° C.

Comparative Preparation Example 2

An apparatus was setup in a similar manner to Preparation Example 1, the 1 L flask was charged with 234 g (13 mols) of water and 35 g of toluene, and the flask was then heated to 80° C. in an oil bath. With the exception of charging the dropping funnel with 137 g (0.65 mols) of phenyltrichlorosilane, 63 g (0.25 mols) of diphenyldichlorosilane and 13 g (0.1 mols) of dimethyldichlorosilane, preparation was conducted in the same manner as Preparation Example 1, yielding 123 g of a solid organopolysiloxane (comparative resin 2).

The thus obtained organopolysiloxane comprised 65 mol % of T units and 35 mol % of D units, 85 mol % of the organic substituents on the Si atoms were phenyl groups, the terminals included 0.3 mols of silanol groups per 100 g of the organopolysiloxane, the external appearance was of a colorless transparent solid, and the weight-average molecular weight was 8,200. Further, the softening point of the resin was 83° C.

The compositions and the weight average molecular weights of the resins obtained in the preparation examples and comparative preparation examples above are shown in Table 1.

Examples 1 to 3, Comparative Examples 1 to 2

Using a solution prepared by dissolving the organopolysiloxane (resins 1 to 3 and comparative resins 1 and 2) in a solvent shown in Table 2 at a concentration shown in Table 2, an adhesive layer having a (dried) thickness shown in Table 2 was formed by spin coating across the entire surface of one side of an 8-inch silicon wafer (thickness: 725 µm). Using a glass sheet with a diameter of 8 inches as a support, this support and the silicon wafer having the adhesive layer formed thereon were then bonded together inside a vacuum bonding apparatus under the conditions shown in Table 2, thus preparing a stacked product.

Subsequently, the tests described below were performed. Further, separate test substrates were also prepared to evaluate the detachability and the cleaning removability of the resins. The results are shown in Table 2.

—Adhesion Test—

Bonding of the 8-inch wafer was performed using a Wafer Bonding System 520IS manufactured by EV Group. The bonding was performed at the bonding temperature shown as "Bonding temperature" in Table 2, at an internal chamber pressure during bonding of not more than $10^{-3}$ mbar, and under a loading of 5 kN. Following bonding, the stacked structure was cooled to room temperature, and the state of adhesion at the bonding interface was inspected visually. In those cases where no anomalies such as gas bubbles had occurred at the interface, the adhesion was evaluated as good and was recorded using the symbol O, whereas in those cases where anomalies were detected, the adhesion was evaluated as poor and was recorded using the symbol x —Back Surface Grinding Durability Test—

Grinding of the back surface of the silicon wafer was conducted using a grinder (DAG810, manufactured by DISCO Corporation). Following grinding down to a final substrate thickness of 50 μm, the wafer was inspected under an optical microscope for the existence of anomalies such as cracking or detachment. In those cases where no anomalies had occurred, the grinding durability was evaluated as good and was recorded using the symbol O, whereas in those cases where anomalies were detected, the grinding durability was evaluated as poor and was recorded using the symbol x.

—Heat Resistance Test—

A stacked structure in which the silicon wafer had been subjected to back surface grinding was placed inside an oven at 250° C. under a nitrogen atmosphere for two hours, and was then heated on a hot plate at 270° C. for 10 minutes and inspected for the existence of external appearance anomalies. In those cases where no external appearance anomalies had occurred, the heat resistance was evaluated as good and was recorded using the symbol O, whereas in those cases where external appearance anomalies were detected, the heat resistance was evaluated as poor and was recorded using the symbol x.

—Detachability Test—

The detachability of a substrate was evaluated in a simulated manner using the test described below.

The adhesive layer described above was formed on a separate 6-inch silicon wafer, and with the wafer undergoing heating on a hot plate at the temperature as "Bonding temperature" shown in Table 2, a silicon substrate that had been cut into a fragment with dimensions of 35 mm×35 mm×thickness: 0.725 mm (hereinafter referred to as the "silicon fragment") was pressed onto and bonded to the wafer. Subsequently, the stacked structure was exposed to the same conditions as the above-described heat resistance test, and a bond tester (series 4000, manufactured by DAGE Precision Industries Ltd.) was used to perform a detachability test described below.

FIG. 1 is a diagram illustrating the method used in the detachability test. As illustrated in FIG. 1, a test piece composed of a silicon wafer 1, an adhesive layer 2 formed on top of the silicon wafer 1, and a silicon fragment 3 bonded to the silicon wafer 1 via the adhesive layer 2 was secured to a heater 4 fitted with a vacuum chuck. With the test piece being heated at 180° C., a probe 5 of the above-mentioned bond tester was moved in the direction of the arrow 6 and pressed against the side of the silicon fragment 3 in a horizontal direction. The size of this pressing force was gradually increased, and the force at the point where the silicon fragment 3 started to slide was measured. In those cases where the silicon fragment started to slide at a horizontal pressing force of not more than 1 N, the detachability was evaluated as good and was recorded using the symbol O, whereas in those cases where a force exceeding 1 N was required, the detachability was evaluated as poor and was recorded using the symbol x.

—Cleaning Removability Test—

A stacked product was prepared using a separate 8-inch wafer in the same manner as that prepared and subjected to the adhesion test, etc. above, and then to heat treatment under the same conditions as in the heat resistance test described above. Thereafter, the wafer was debonded from the glass sheet in a sliding fashion at 180° C. with a debonding system (EVG805). The side debonded from the glass sheet of the wafer has a remaining adhesive layer. The wafer thus obtained was subjected to the following cleaning removability test.

The wafer was secured on a spin coater with the adhesive layer facing upward, and propylene glycol monomethyl ether was sprayed onto the wafer as a cleaning solvent. The propylene glycol monomethyl ether was left to sit on the wafer for two minutes at 23° C. and was then removed by rotating the coater, and this operation of spraying propylene glycol monomethyl ether onto the wafer and leaving it to sit for two minutes was repeated a further two times. Subsequently, with the wafer being spun, isopropyl alcohol (IPA) was sprayed on to the wafer to perform a rinse. Subsequently, the external appearance of the wafer was inspected visually for the presence of residual adhesive resin. In those cases where no resin residues were detected, the cleaning removability was evaluated as good and was recorded using the symbol O, whereas in those cases where resin residues were detected, the cleaning removability was evaluated as poor and was recorded using the symbol x.

TABLE 1

|   | Preparation Example 1 Resin 1 | Preparation Example 2 Resin 2 | Preparation Example 3 Resin 3 | Comparative Preparation example 1 Comparative resin 1 | Comparative Preparation example 2 Comparative resin 2 |
|---|---|---|---|---|---|
| T units (mol %) | 70 | 55 | 60 | 25 | 65 |
| D units (mol %) | 20 | 30 | 15 | 65 | 35 |
| M units (mol %) | 10 | 15 | 15 | 10 | — |
| Q units (mol %) | — | — | 10 | — | — |
| Weight-average molecular weight | 9,600 | 11,200 | 10,200 | 11,700 | 8,200 |

TABLE 2

|  | Example 1 | Example 2 | Example 3 | Comparative example 1 | Comparative example 2 |
|---|---|---|---|---|---|
| Resin 1 | 70 | — | — | — | — |
| Resin 2 | — | 60 | — | — | — |
| Resin 3 | — | — | 65 | — | — |
| Comparative resin 1 | — | — | — | 75 | — |
| Comparative resin 2 | — | — | — | — | 65 |
| Cyclopentanone | 30 | 30 | — | — | 35 |
| PGMEA (*) | — | 10 | 35 | 25 | — |
| Thickness (μm) | 20 | 30 | 20 | 20 | 20 |
| Bonding temperature | 140° C. | 160° C. | 170° C. | 140° C. | 160° C. |
| Adhesion | ○ | ○ | ○ | ○ | ○ |
| Back surface grinding durability | ○ | ○ | ○ | X | ○ |
| Heat resistance | ○ | ○ | ○ | — | X |
| Detachability | ○ | ○ | ○ | — | X |
| Cleaning removability | ○ | ○ | ○ | — | X |

(Note: PGMEA (*) = propylene glycol monomethyl ether acetate)

INDUSTRIAL APPLICABILITY

The temporary adhesive composition of the present invention is useful, for example in the field of semiconductor production, for achieving temporary adhesion between wafers or between a wafer and a support, such as the case where the circuit-formed surface of a semiconductor wafer is bonded to a support while the non-circuit-formed surface of the wafer is subjected to grinding, and the support is then readily detached following completion of the grinding.

What is claimed is:

1. A temporary adhesive composition comprising:
   (A) an organopolysiloxane comprising:
      (I) 40 to 99 mol % of siloxane units represented by $R^1SiO_{3/2}$ (T units),
      (II) 0 to 49 mol % of siloxane units represented by $R^2R^3SiO_{2/2}$ units (D units) and
      (III) 1 to 25 mol % of siloxane units represented by $R^4R^5R^6SiO_{1/2}$ units (M units), wherein each of $R^1$ to $R^6$ represents an unsubstituted monovalent hydrocarbon group of 1 to 10 carbon atoms selected from the group consisting of an alkyl group, a cycloalkyl group, and an aryl group, and substituted groups of these hydrocarbon groups in which at least a portion of the hydrogen atoms have been substituted with a halogen atom or a cyano group,
      and having a weight-average molecular weight exceeding 2,000, and
   (B) an organic solvent having a boiling point of not more than 220° C.

2. The composition according to claim 1, wherein the organopolysiloxane of component (A) is composed of:
   (I) 40 to 98.9 mol % of the T units,
   (II) 0 to 48.9 mol % of the D units,
   (III) 0.1 to 30 mol % of siloxane units represented by $SiO_{4/2}$ (Q units), and
   (IV) 1 to 25 mol % of the M units.

3. The composition according to claim 1, wherein each of $R^1$ to $R^6$ represents a methyl group, n-propyl group or phenyl group.

4. The composition according to claim 1, wherein relative to the combined total of all the organic substituents in the organopolysiloxane of component (A), the phenyl group content is not less than 40 mol %.

5. The composition according to claim 1, wherein relative to the combined total of all the organic substituents in the organopolysiloxane of component (A), the phenyl group content is within a range from 50 to 90 mol %.

6. The composition according to claim 1, wherein the organopolysiloxane of component (A) has a softening point that is within a temperature range from 40 to 300° C., and is a solid at temperatures not exceeding 40° C.

7. The composition according to claim 1, wherein the weight-average molecular weight is within a range from 3,000 to 80,000.

8. The composition according to claim 1, wherein the organic solvent of component (B) is a hydrocarbon, ketone, ester, ether, alcohol, or a mixture of two or more thereof.

9. The composition according to claim 1, wherein the organic solvent of component (B) is isododecane, cyclopentanone, cyclohexanone, propylene glycol monomethyl ether acetate, propylene glycol monomethyl ether or a mixture of two or more thereof.

10. The composition according to claim 1, wherein the organic solvent of component (B) is present in an amount of 11 to 150 parts by mass per 100 parts by mass of the organopolysiloxane of component (A).

11. A method of producing a thin wafer, the method comprising:
   (a) bonding a circuit-formed surface of a wafer having the circuit-formed surface and a non-circuit-formed surface to a support with an adhesive layer composed of the temporary adhesive composition defined in claim 1 disposed therebetween,
   (b) grinding the non-circuit-formed surface of the wafer bonded to the support,
   (c) processing the non-circuit-formed surface of the wafer that has undergone grinding of the non-circuit-formed surface,
   (d) detaching the processed wafer from the support, and
   (e) removing residual adhesive composition from the circuit-formed surface of the detached wafer.

* * * * *